United States Patent
Noh et al.

(10) Patent No.: US 7,508,041 B2
(45) Date of Patent: Mar. 24, 2009

(54) MAGNETIC MEMORY DEVICE HAVING UNIFORM SWITCHING CHARACTERISTICS AND CAPABLE OF SWITCHING WITH LOW CURRENT AND ASSOCIATED METHODS

(75) Inventors: Jin-seo Noh, Seoul (KR); Tae-wan Kim, Yongin-si (KR); Hong-seog Kim, Daejeon (KR); Eun-sik Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 449 days.

(21) Appl. No.: 11/208,618

(22) Filed: Aug. 23, 2005

(65) Prior Publication Data

US 2006/0038247 A1 Feb. 23, 2006

(30) Foreign Application Priority Data

Aug. 23, 2004 (KR) .................. 10-2004-0066395

(51) Int. Cl.
*H01L 29/82* (2006.01)
*H01L 43/00* (2006.01)
(52) U.S. Cl. .............. 257/422; 257/E21.605; 365/171; 365/173; 438/3
(58) Field of Classification Search .......... 257/422, 257/E21.605; 365/171, 173; 438/3
See application file for complete search history.

(56) References Cited

U.S. PATENT DOCUMENTS

| | | | |
|---|---|---|---|
| 6,577,526 B1 * | 6/2003 | Schwarzl | 365/158 |
| 6,621,730 B1 * | 9/2003 | Lage | 365/158 |
| 6,936,479 B2 * | 8/2005 | Sharma | 438/3 |
| 6,951,789 B2 * | 10/2005 | Voshell et al. | 438/241 |
| 7,095,069 B2 * | 8/2006 | Cha | 257/295 |
| 7,109,045 B2 * | 9/2006 | Yagami et al. | 438/3 |
| 7,205,598 B2 * | 4/2007 | Voshell et al. | 257/301 |
| 2003/0183889 A1 * | 10/2003 | Kajiyama | 257/421 |
| 2004/0166640 A1 * | 8/2004 | Yagami et al. | 438/277 |
| 2004/0175887 A1 * | 9/2004 | Cha | 438/257 |

* cited by examiner

*Primary Examiner*—Ngan Ngo
(74) *Attorney, Agent, or Firm*—Lee & Morse, P.C.

(57) ABSTRACT

A magnetic memory device includes a magnetic tunneling junction (MTJ) structure having a cylindrical shape. Elements of the MTJ structure are co-axial. The MTJ structure includes a conductive layer, an insulating layer co-axially formed around the conductive layer and a material layer formed around the insulating layer, the material layer being co-axial with the conductive layer and having a plurality of magnetic layers. The material layer includes a lower magnetic layer, a tunneling layer, and an upper magnetic layer that are sequentially stacked around and along the conductive layer.

23 Claims, 9 Drawing Sheets

MAGNETIC MEMORY DEVICE HAVING UNIFORM SWITCHING CHARACTERISTICS AND CAPABLE OF SWITCHING WITH LOW CURRENT AND ASSOCIATED METHODS

BACKGROUND OF THE INVENTION

1. Field of the Invention

The present invention relates to a semiconductor memory device and associated methods. More particularly, the present invention relates to a magnetic memory device having uniform switching characteristics and capable of switching with a low current, a method of operating the same and a method of making the same.

2. Description of the Related Art

A magnetic RAM includes a field effect transistor as a switching device and a magnetic tuneling junction MTJ cell as a data storing unit. The MTJ cell includes a tunneling layer and magnetic layers formed on and under the tuneling layer. The resistance of the MTJ cell varies depending on the magnetization orientations of the magnetic layers formed on and under the tuneling layer. The magnetic RAM utilizes this property of the MTJ cell to store data in the MTJ cell.

FIG. 1 illustrates a sectional view of a conventional magnetic RAM.

Referring to FIG. 1, a conventional magnetic RAM includes a semiconductor substrate 10 and a gate stack structure 12 on the semiconductor substrate 10. The gate stack structure 12 includes a gate electrode. A source region 14 and a drain region 16 are formed on the semiconductor substrate 10 on either side of the gate stack structure 12. The gate stack structure 12, the source region 14 and the drain region 16 form a transistor T. A field oxide layer 11 is on either side of the source and drain regions opposite the gate stack structure 12. An interlayer insulating layer 18 covers the transistor T. A digit line 20 is also formed over the gate stack structure 12. The digit line 20 is covered with the interlayer insulating layer 18 and is formed in parallel with the gate stack structure 12. A contact hole 22 is formed in the interlayer insulating layer 18. The drain region 16 is exposed through the contact hole 22. The contact hole 22 is filled with a conductive plug 24, and the top of the conductive plug 24 is in contact with a pad conductive layer 26 formed on the interlayer insulating layer 18. The pad conductive layer 26 is formed over the digit line 20.

An MTJ structure S is formed on the pad conductive layer 26 and it is aligned with the digit line 20. A second interlayer insulating layer 28 covering the MTJ structure S and the pad conductive layer 26 is formed. A via hole 30 is formed in the second interlayer insulating layer 28 to expose an upper layer of the MTJ structure S. A bit line 32 is formed on the second interlayer insulating layer 28 to fill the via hole 30. The bit line 32 extends across the gate electrode and the digit line 20 in a perpendicular direction.

FIG. 2 illustrates a detailed view of the MTJ structure S.

Referring to FIG. 2, the MTJ structure S includes a seed layer 40 formed on the pad conductive layer 26 and a pinning layer 42, a pinned layer 44, a tunneling oxide layer 48, a free magnetic layer 50, and a capping layer 52 that are sequentially formed on the seed layer 40.

To accurately read data from the magnetic RAM, the magnetic RAM should have a large sensing margin. The sensing margin of the magnetic RAM is determined by a magnetic resistance ratio (MR ratio) of the MTJ structure. In other words, a difference between a minimum resistance and a maximum resistance of the MTJ structure should be large.

To increase the MR ratio of the MTJ structure, it is preferable that the MTJ structure is stable and has a uniform thickness. Particularly, the thickness of the tunneling layer must be uniform. For this, the manufacturing process of the tunneling layer must be stable. Further, good selectivity is required. That is, when a MTJ structure is selected from the magnetic RAM, neighboring MTJ structures should not be affected by the selection.

In the conventional magnetic RAM, however, abnormal phenomena, such as vortex pinning, illustrated in FIG. 3, and domain wall pinning, illustrated in FIG. 4, are present in the free magnetic layer when data is written to the MTJ structure layer or read from the MTJ structure. Vortex pinning and domain wall pinning obstruct a normal switching operation of the free magnetic layer of the MTJ structure. That is, vortex pinning or domain wall pinning significantly increases the magnetic field required for a switching operation of the free magnetic layer, thereby increasing current required for generating the magnetic field.

When vortex pinning or domain wall pinning occurs and a normal amount of current is applied to the MTJ structures, there may be MTJ structures whose free magnetic layers are not switched. These MTJ structures become fail bits.

FIG. 5 illustrates a fail bit ratio resulting from writing data to a conventional magnetic RAM with the MTJ structure depicted in FIG. 2. Referring to FIG. 5, MTJ structures that are not switched under normal switching fields are denoted by C1, C2, C3 and C4. The MTJ structures C1, C2 and C4 are switched by a switching field that is stronger than the normal switch field, and the MTJ structure C3 is switched by a switching field weaker than the normal switch field.

Though vortex pinning can be somewhat decreased by reducing the thickness of the free magnetic layer, such a reduction in thickness significantly lowers the thermal stability of the magnetic moment of the free magnetic layer and thereby increases the MTJ structure's thermal instability.

SUMMARY OF THE INVENTION

The present invention is therefore directed to an magnetic memory device, a method of operating the same and a method of making the same, which substantially overcomes one or more of the problems due to the limitations and disadvantages of the related art.

It is a feature of the present invention to provide a magnetic memory device in which a free magnetic layer of an MTJ structure has uniform switching characteristics.

It is another feature of the present invention to provide a magnetic memory device in which a free magnetic layer of an MTJ structure has low-current switching characteristics.

It is yet another feature of the present invention to provide a magnetic memory device in which a free magnetic layer of an MTJ structure has stable thermal characteristics.

It is still another feature of the present invention to provide a method of operating a magnetic memory device having a uniform switching characteristics and capable of switching with a low current.

It is yet another feature of the present invention to provide a method of making an MTJ structure.

At least one of the above and other features and advantages of the present invention may be realized by providing a magnetic memory device including a magnetic tunneling junction (MTJ) structure having a cylindrical shape, elements of the MTJ structure being co-axial with one another.

The elements of the MTJ structure may include a conductive layer, an insulating layer co-axially formed around the conductive layer, and a material layer formed around the insulating layer, the material layer being co-axial with the conductive layer and having a plurality of magnetic layers.

The plurality of magnetic layers may include a lower magnetic layer, a tunneling layer, and an upper magnetic layer that are sequentially stacked around and along the conductive layer. The lower magnetic layer may include a pinning layer and a pinned layer that are sequentially stacked. The pinned layer may include a hard magnetic layer which is one of a samarium cobalt (SmCo) layer and a neodymium iron boron (NdFeB) layer. The lower magnetic layer may include a pinned layer made of a hard magnetic material. The upper magnetic layer may include a soft magnetic layer selected from the group consisting of a nickel iron (NiFe) layer and a sequentially stacked layer of a cobalt iron (CoFe) layer and a nickel iron (NiFe) layer.

The magnetic memory device may include a first conductive line connected to the material layer, and a second conductive line connected to the conductive layer. The second conductive line may be formed above the first conductive line, and the first conductive line and the conductive layer may be insulated from each other. The conductive layer may protrude upward to be connected with the second conductive layer.

The magnetic memory device may include a switching device under the MTJ structure, the switching device being connected to the conductive layer and the material layer The magnetic memory device may include a first connecting unit having a first switching unit to switch current flow between the switching device and the material layer and a second connecting unit having a second switching unit to switch current flow between the switching device and the conductive layer.

The magnetic memory device may include a first transistor formed under the MTJ structure and connected with the material layer and a second transistor formed under the MTJ structure and connected with the conductive layer. The first and the second transistors may be formed on the same substrate, and a common electrode may be connected between the first and the second transistors.

At least one of the above and other features and advantages of the present invention may be realized by providing a method of operating a magnetic memory device including an MTJ structure, a first conductive line, a second conductive line, and a switching device, the MTJ structure having a cylindrical shape, a conductive layer at a center, an insulating layer co-axially formed around the conductive layer, and a material layer having a plurality of magnetic layers that are formed around the insulating layer in a co-axial relationship with the conductive layer, the method including connecting the first conductive line to the material layer, connecting the second conductive line to the conductive layer, connecting the switching device to the conductive layer and the material layer, and applying a current to one of the first and second conductive lines after floating another one of the first and second conductive lines.

Applying the current may include applying a write current to the second conductive line after floating the first conductive line to write data in the material layer. Applying the current may include applying a read current to the first conductive line after floating the second conductive line, measuring the current passing through the material layer and reading data from the material layer by comparing the measured current with a reference current.

At least one of the above and other features and advantages of the present invention may be realized by providing a method of making a magnetic memory device including a magnetic tunneling junction (MTJ) structure, the method including forming a plurality of sequential magnetic layers, forming a hole in the plurality of sequential magnetic layers, forming an insulating layer in the hole, the insulating layer lining sidewalls of the hole, and forming a conductive layer in the hole having the insulating layer therein.

Forming the plurality of seqeuntial magnetic layers may include forming a lower magnetic layer, forming a tunneling layer and forming an upper magnetic layer, the lower magnetic layer, the tunneling layer and the upper magentic layer being sequentially stacked. Forming the lower magnetic layer may include forming a pinning layer and forming a pinned layer, the pinning layer and the pinned layer being sequentially stacked.

According to the present invention, the free magnetic layer can be prevented from abnormal pinning phenomena during operation of the magnetic RAM, such that the free magnetic layer can be uniformly switched with a significantly reduced current.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
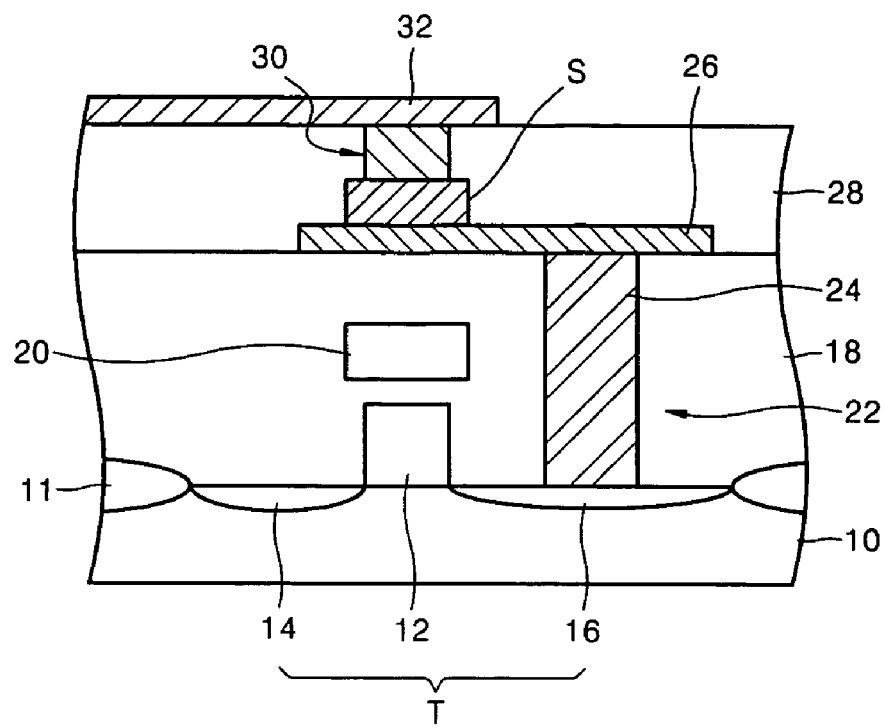
FIG. 1 illustrates a cross-sectional view of a magnetic RAM according to the related art.
Figure 2:
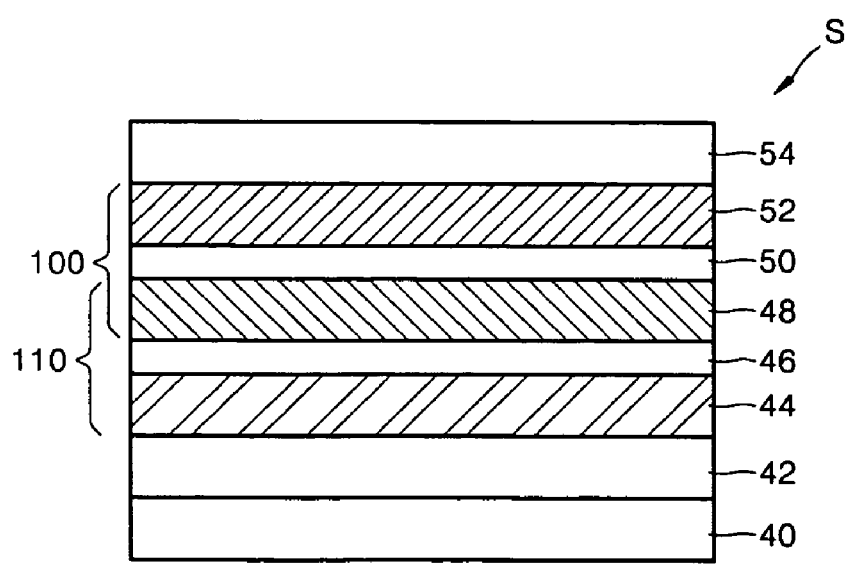
FIG. 2 illustrates a detailed cross-sectional view of a magnetic tunneling junction (MTJ) structure of the magnetic RAM in FIG. 1.
Figure 3:
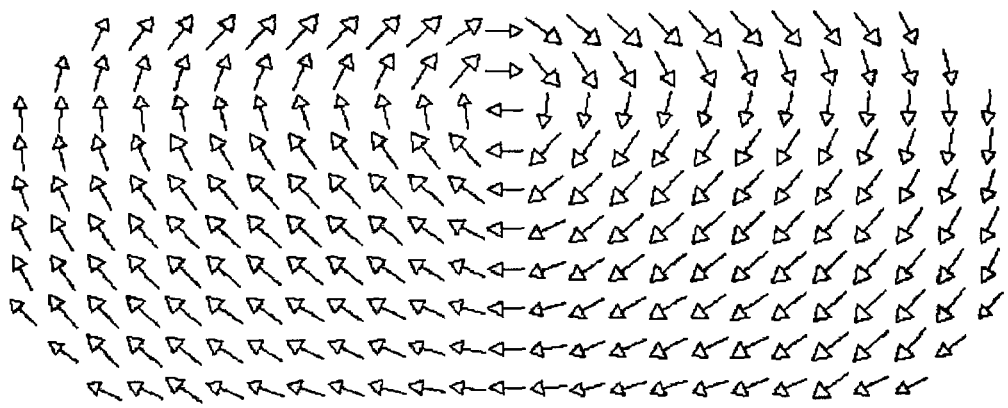
FIG. 3 illustrates vortex pinning that may appear in a free magnetic layer during data write and read modes of the MTJ structure depicted in FIG. 2.
Figure 4:
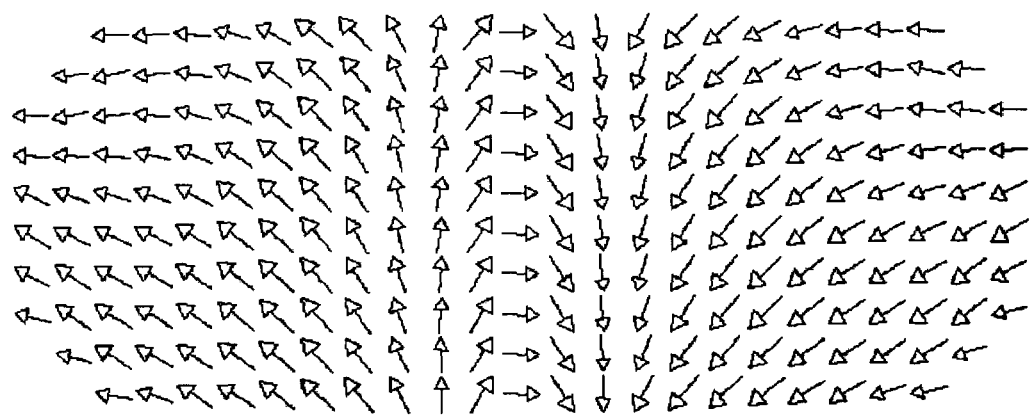
FIG. 4 illustrates domain wall pinning that may appear in a free magnetic layer during data write and read modes on the MTJ structure depicted in FIG. 2.
Figure 5:
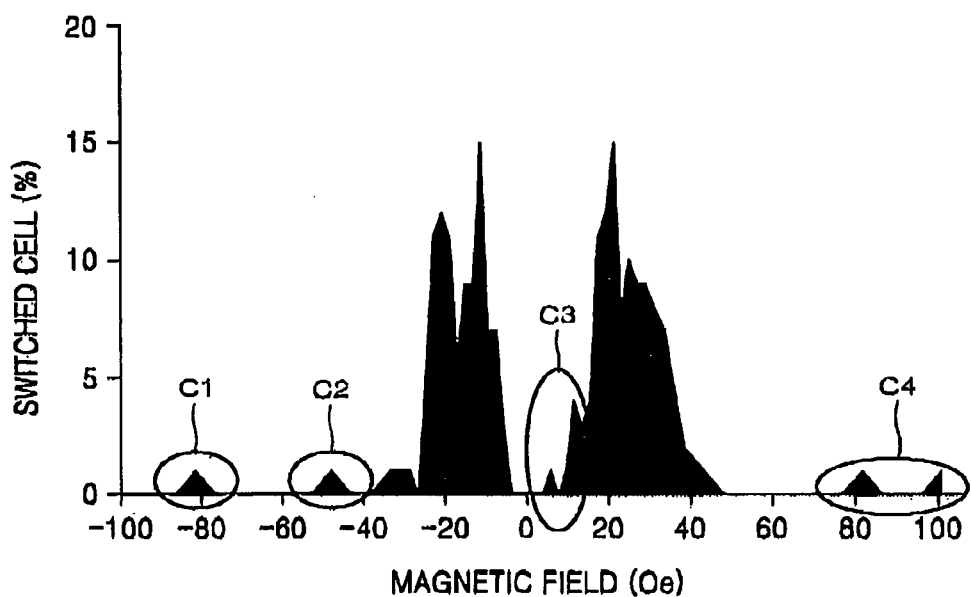
FIG. 5 illustrates a distribution of normally switched MTJ structures and abnormally switched MTJ structures during data write mode of the magnetic RAM depicted in FIG. 1.

Korean Patent Application No. 10-2004-0066395, filed on Aug. 23, 2004, in the Korean Intellectual Property Office, and entitled "Magentic Memory Device Having Uniform Switching Characteristics and Capable of Switching with Low Current and Method of Operating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 6:
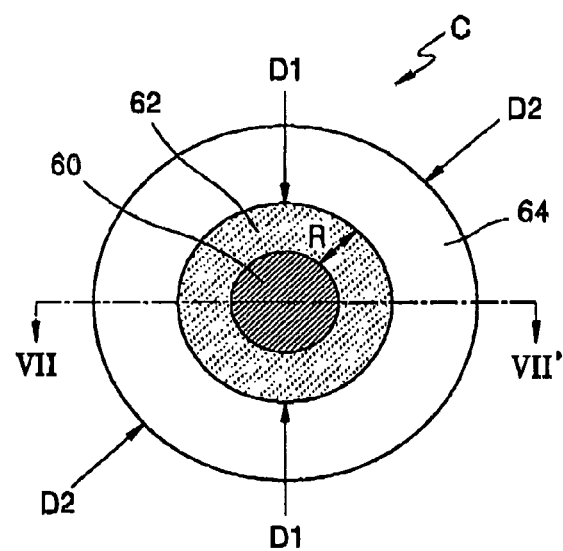
FIG. 6 illustrates a plan view of a MTJ structure of a magnetic RAM according to an embodiment of the present invention.

First, a magnetic RAM of an embodiment of the present invention will be described. FIG. 6 illustrates a plan view of a MTJ structure C of a magnetic RAM according to an embodiment of the present invention, and FIG. 7 illustrates a cross-sectional view taken along line VII-VII' in FIG. 6.

Figure 7:
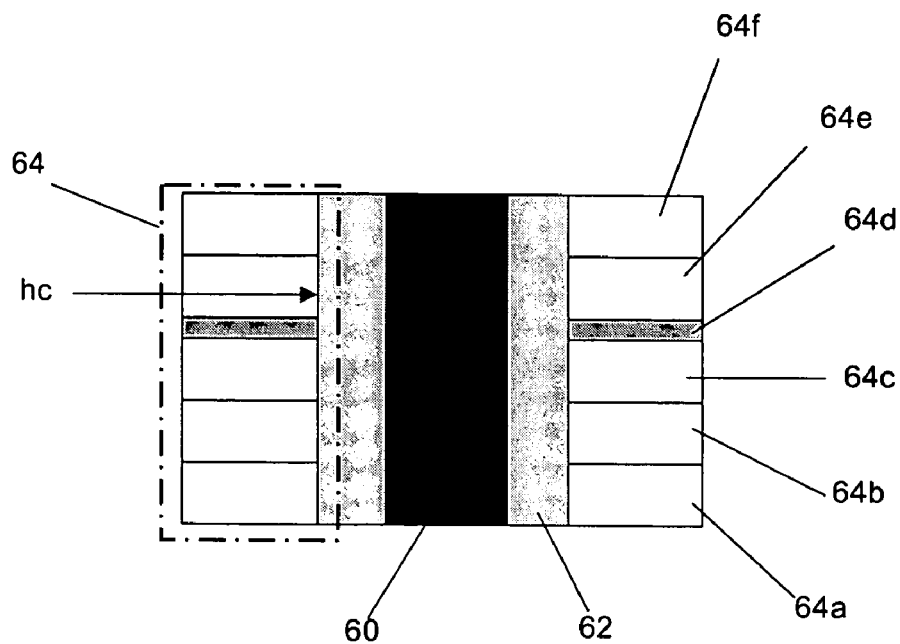
FIG. 7 illustrates a cross-sectional view taken along line VII-VII' in FIG. 6.

Referring to FIGS. 6 and 7, the MTJ structure C of the present invention may have a cylindrical shape. The MTJ structure C may include a cylindrical conductive layer 60 at its center, an insulating layer 62 around the conductive layer 60 and a material layer 64 around the insulating layer 62. The conductive layer 60 may be made of a conductive material, e.g., aluminum (Al) or copper (Cu). The insulating layer 62 may be formed with a predetermined thickness around the conductive layer 60. The insulating layer 62 may be made of an oxide, e.g., silicon oxide ($SiO_2$) or of a non-oxide, e.g., a nitride. The material layer 64 may include a plurality of magnetic layers. The material layer 64 has an inner diameter D1 and an outer diameter D2.

Referring to FIG. 7, the plurality of magnetic layers may be stacked in a vertical direction around the conductive layer 60 to form the material layer 64. The plurality of magnetic layers of the material layer 64 may include a buffer layer 64a, a pinning layer 64b, a pinned layer 64c, a tunneling layer 64d, a free magnetic layer 64e, and a capping layer 64f that are sequentially stacked. The buffer layer 64a may be formed to insure good crystal growth and surface shape of the next sequential layer, i.e., the pinning layer 64b. The buffer layer 64a may be made of ruthenium (Ru), tantalum (Ta), cobalt zirconium niobium (Co/Zr/Nb, CZN). The pinning layer 64b fixes a magnetized orientation of the pinned layer 64c in a given direction. The pinning layer 64b may be a single layer or a multiple layer. The pinning layer 64b may be a synthetic antiferro-magnetic (SAF) layer (not shown) including a lower magnetic layer, a middle magnetic layer and an upper magnetic layer that are stacked in sequence. The lower and the upper magnetic layers may be ferromagnetic layers, e.g., a cobalt-iron (CoFe) layer, and the middle magnetic layer may be a metal layer, e.g., ruthenium (Ru) layer.

The pinned layer 64c may be a hard magnetic layer, e.g., a samarium cobalt (SmCo) layer or a neodymium iron boron (NdFeB) layer. When the pinned layer 64c has a high coercivity, the pinning layer 64b can be omitted. The tunneling layer 64d may be an oxide layer, e.g., an aluminum oxide ($AlO_x$) layer, with a predetermined thickness, or may be a different insulating layer. The free magnetic layer 64e may be a soft magnetic layer having a magnetic moment at a predetermined thickness. For example, the free magnetic layer 64e may be a nickel iron (NiFe) layer, or may be a multiple layer of a cobalt iron (CoFe) layer and a nickel iron (NiFe) layer that are sequentially stacked. The capping layer 64f may be a ruthenium (Ru) layer or a tantalum (Ta) layer.

Figure 8:
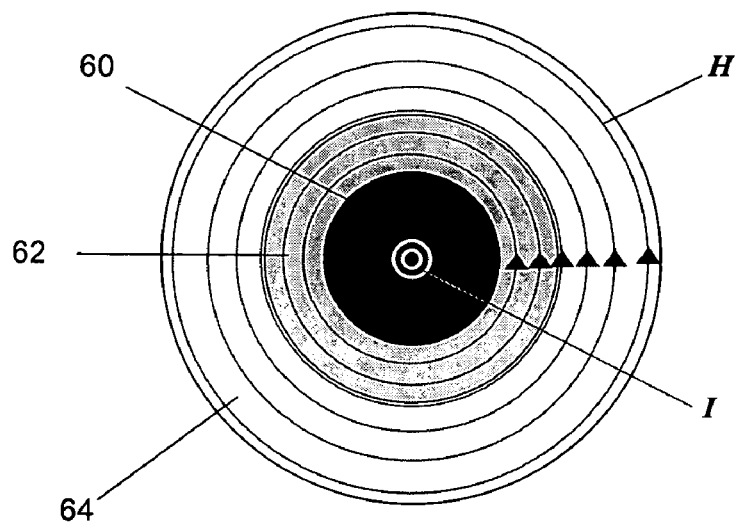
FIG. 8 illustrates a plan view showing a magnetic induction of the MTJ structure of FIG. 6.

In the MTJ structure C, the pinning layer 64b, the pinned layer 64c, the tunneling layer 64d, the free magnetic layer 64e, and the capping layer 64f may be sequentially stacked around and along the conductive layer 60 in a vertical direction to be in a coaxial relationship with the conductive layer 60. Therefore, a current I flowing through the conductive layer 60 induces a circular closed magnetic field H around the conductive layer 60 as shown in FIG. 8. Since this magnetic field H forms a closed loop in the free magnetic layer 64e without penetrating the free magnetic layer 64e, the magnetic moment of the free magnetic layer 64e is aligned along the circular closed magnetic field H. This magnetic moment orientation of the free magnetic layer 64e prevents abnormal pinning phenomena, such as vortex pinning and domain wall pinning, that are present in the free magnetic layer of the conventional MTJ structure.

The circular closed magnetic field H satisfies the equation below:

$$H=(2I)/(10R)$$

where "I" is the current of the conductive layer 60 and "R" is the thickness of the insulating layer 62 formed around the conductive layer 60. When compared with the conventional MTJ structure, the MTJ structure C of an embodiment of the present invention produces a much larger magnetic field H around the conductive layer 60 with a much smaller current. For example, when current I=0.1 mA and thickness R=0.1 μm, a magnetic field H of 200 oersteds (Oe) may be induced in the MTJ structure C in accordance with an embodiment of the present invention. In contrast, when a current of about 4-5 mA is applied to the conventional MTJ structure, a magnetic field of about 20 Oe may be induced.

Figure 9:
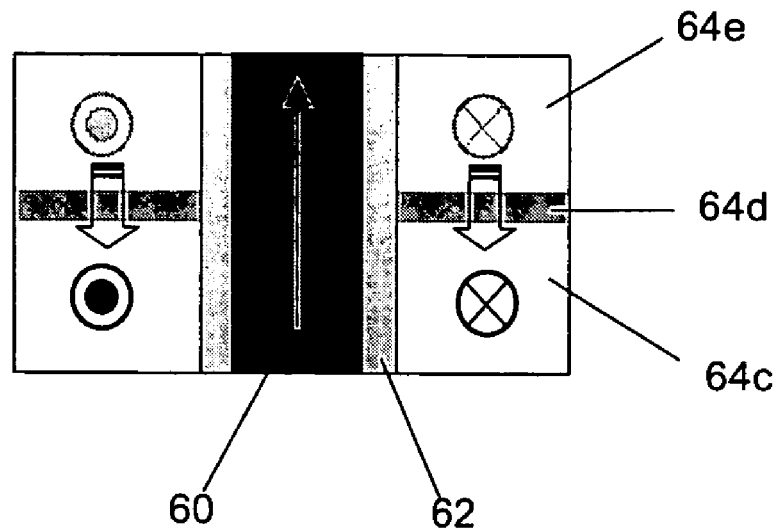
FIG. 9 illustrates a cross-sectional view showing a magnetized state of a free magnetic layer of the MTJ structure of FIG. 7, when a magnetic resistance is low.
Figure 10:
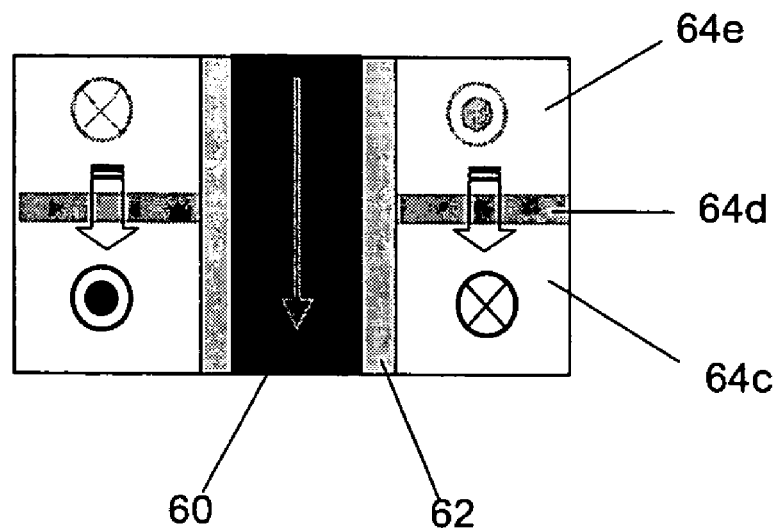
FIG. 10 illustrates a cross-sectional view showing a magnetized state of a free magnetic layer of the MTJ structure of FIG. 7, when a magnetic resistance is high.

FIG. 9 illustrates that the free magnetic layer 64e has the same magnetized state as the pinned layer 64c, and FIG. 10 illustrates a reversal of FIG. 9. The magnetic resistance of the tunneling layer 64d is low in FIG. 9 and is high in FIG. 10.

The MTJ structure C shown in FIGS. 6 and 7 may be formed as follows. The buffer layer 64a, the pinning layer 64b, the pinned layer 64c, the tunneling layer 64d, the free magnetic layer 64e, and the capping layer 64f may be sequentially stacked on a base substrate; a mask (not shown), e.g., a photoresist film pattern, may be formed on the capping layer 64f, the mask exposing some portion of the capping layer 64f where the conductive layer 60 and the insulating layer 62 are to be formed. The capping layer 64f and the other layers of the material layer 64 may be removed, exposing the base substrate, thereby defining a contact hole hc in the MTJ structure C. The photoresist film pattern may then be removed. Then the insulating layer 62 may be formed inside the contact hole hc and the conductive layer 60 may be formed on the capping layer 64f to fill the inside of the insulating layer 62; and the conductive layer 60 may be removed until the capping layer

64f is exposed. Through this exemplary process, the MTJ structure C having the section shown in FIG. 7 may be formed.

A magnetic RAM with MTJ structures in accordance with the present inveniton will now be described in detail.

FIRST EMBODIMENT

Figure 11:
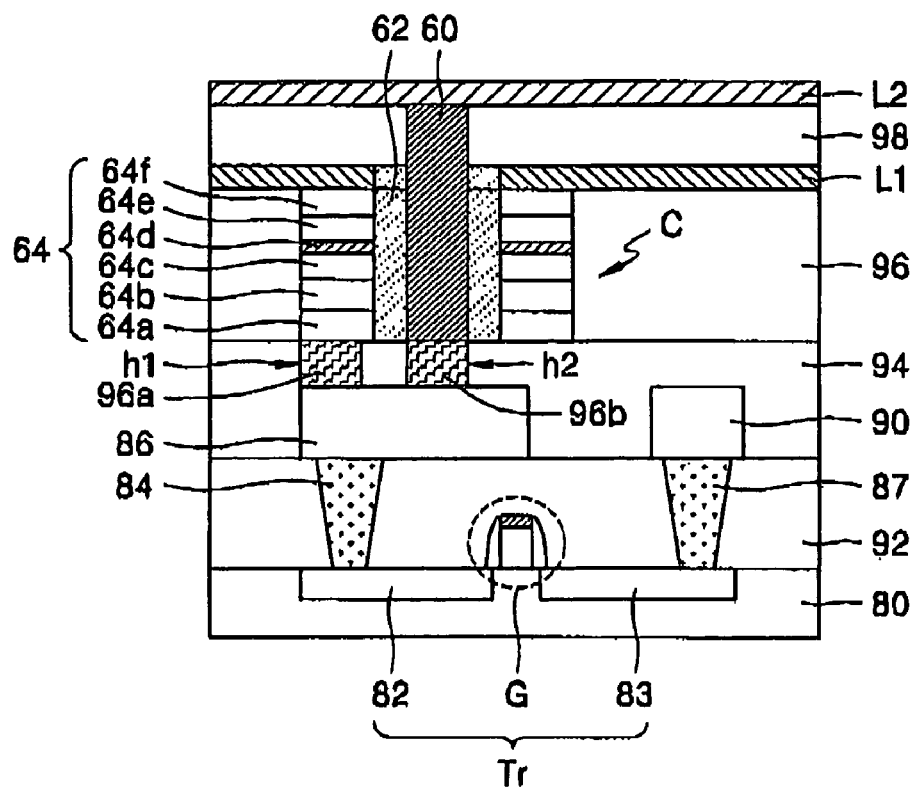
FIG. 11 illustrates a cross-sectional view of a magnetic RAM provided with the MTJ structure of FIGS. 6 and 7 according to a first embodiment of the present invention.

Referring to FIG. 11, a magnetic RAM according to a first embodiment (hereinafter, "a first magnetic RAM") includes a semiconductor substrate 80, a transistor Tr formed on the semiconductor substrate 80, and the MTJ structure C formed above the transistor Tr. The transistor Tr and the MTJ structure C are connected to each other via a conductive plug 84 and a conductive pad 86. The conductive plug 84 is formed on a conductive first impurity region 82 of the transistor Tr. The conductive pad 86 connects the conductive plug 84 and the MTJ structure C. The conductive pad 86 makes contact with the MTJ structure C at two places, i.e., the conductive layer 60 and the material layer 64. Though not shown, a first switching unit may be formed between the conductive pad 86 and the conductive layer 60 of the MTJ structure C, and a second switching unit may be formed between the conductive pad 86 and the material layer 64 of the MTJ structure C. In operation of the first magnetic RAM, a current from the MTJ structure C to the conductive pad 86 can be selectively controlled.

The transistor Tr may include the first impurity region 82, a second impurity region 83, and a gate stack structure G between the first impurity region 82 and the second impurity region 83. The second impurity region 83 may be connected with a common electrode 90 via a conductive plug 87. A first interlayer insulating layer 92 may be formed between the conductive pad 86 and the semiconductor substrate 80 to cover the transistor Tr and enclose the first and the second impurity regions 82 and 83.

A second interlayer insulating layer 94 may be formed on the first interlayer insulating layer 92 to cover the common electrode 90 and the conductive pad 86. The second interlayer insulating layer 94 may define a first contact hole h1 and a second contact hole h2 to expose the conductive pad 86 at two positions. The first contact hole h1 may be filled with a first connecting unit 96a. The first connecting unit 96a may be a switching unit, e.g., a transistor, to switch a current flow between the material layer 64 and the conductive pad 86. The second contact hole h2 may be filled with a second connecting unit 96b to electrically connect the conductive pad 86 with the conductive layer 60. The second connecting unit 96b may be a switching unit to switch a current flow between the conductive layer 60 and the conductive pad 86. A third interlayer insulating layer 96 may be formed on the second interlayer insulating layer 94 to enclose the MTJ structure C.

A first conductive line L1 and a second conductive line L2 that are spaced apart from each other in a vertical direction may be formed on the third interlayer insulating layer 96. The first and the second conductive line L1 and L2 may be arranged in a perpendicular direction to the gate stack structure G. The first conductive line L1 may make contact with the material layer 64 but not with the conductive layer 60. For this, the insulating layer 62 may extend between the first conductive line L1 and the conductive layer 60. While the second conductive line L2 may be aligned with the first conductive line L1, the second conductive line L2 may be slightly misaligned with the first conductive line L1.

The conductive layer 60 may extend upward to make contact with the second conductive line L2. In this configuration, a current can be selectively applied to the conductive layer 60 and the material layer 64 of the MTJ structure C. The first conductive line L1 may be used for a read bit line and the second conductive line L2 may be used for a write bit line. A fourth interlayer insulating layer 98 may be formed on the third interlayer insulating layer 96 to cover the first conductive line L1 and to enclose the extended portion of the conductive layer 60. The second conductive line L2 may be formed on the fourth interlayer insulating layer 98.

Figure 12:
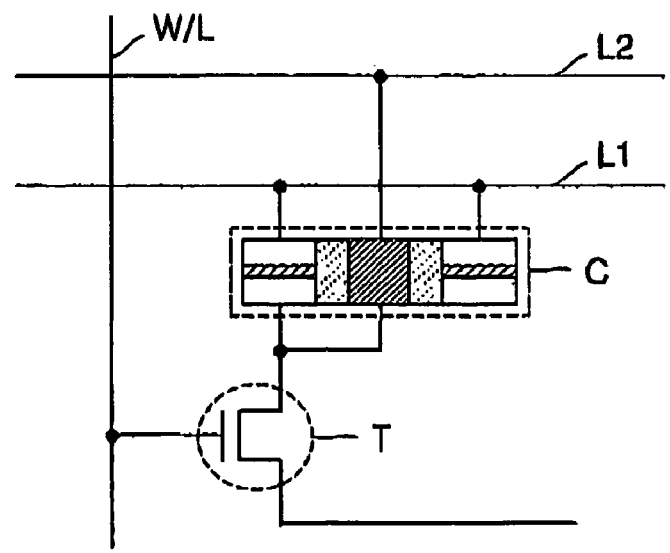
FIG. 12 illustrates an equivalent circuit of FIG. 11.

FIG. 12 illustrates an equivalent circuit of the first magnetic RAM of FIG. 11.

SECOND EMBODIMENT

Figure 13:
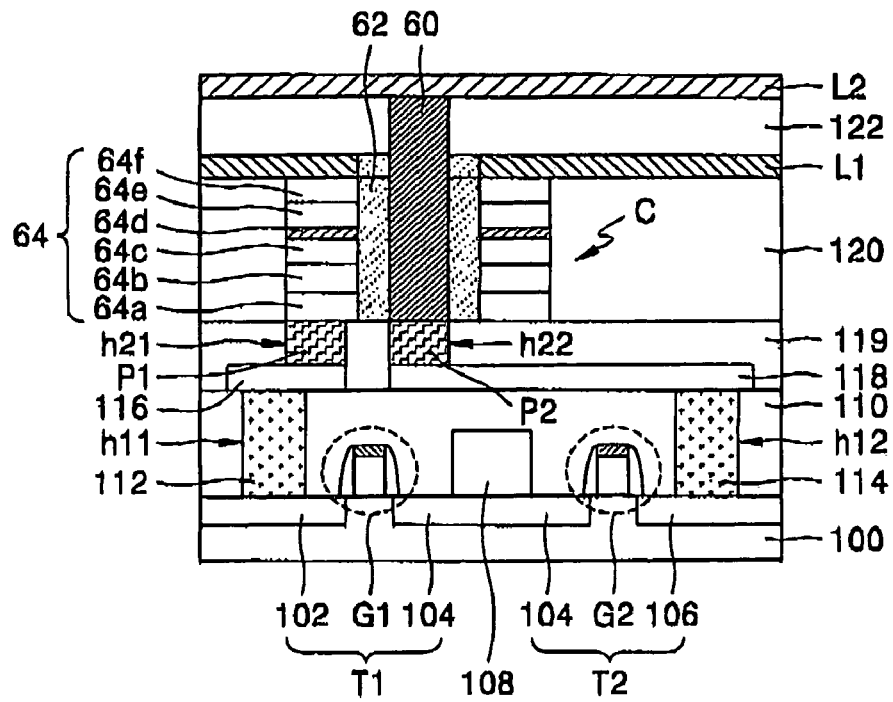
FIG. 13 illustrates a cross-sectional view of a magnetic RAM provided with the MTJ structure depicted in FIGS. 6 and 7 according to a second embodiment of the present invention.

FIG. 13 illustrates a magnetic RAM according to a second embodiment (hereinafter, "a second magnetic RAM").

Referring to FIG. 13, the second magnetic RAM includes a first transistor T1 and a second transistor T2 formed on a semiconductor substrate 100. Alternatively, the first and the second transistor T1 and T2 may be replaced with other switching devices. The first transistor T1 may include a first impurity region 102, a second impurity region 104, and a first gate stack structure G1 between the first impurity region 102 and the second impurity region 104. The second transistor T2 may include the second impurity region 104, a third impurity region 106, a second gate stack structure G2 between the second impurity region 104 and the third impurity region 106. The second impurity region 104 may be included both in the first and the second transistors T1 and T2 as a common drain region. A common electrode 108 may be formed on the second impurity region 104.

The first transistor T1, the second transistor T2 and the common electrode 108 may be covered by a first interlayer insulating layer 110 of which surface is planarized. The first interlayer insulating layer 110 may define a first contact hole h11 and a second contact hole h12 to expose the first impurity region 102 and the third impurity region 106, respectively. The first and the second contact holes h11 and h12 may respectively be filled with a first conductive plug 112 and a second conductive plug 114.

A first conductive pad 116 and a second conductive pad 118 that are spaced apart from each other may be formed on the first interlayer insulating layer 110. The first conductive pad 116 may be connected to the first conductive plug 112, and the second conductive pad 118 may be connected to the second conductive plug 114. A second interlayer insulating layer 119 may be formed on the first interlayer insulating layer 110 to cover the first conductive pad 116 and the second conductive pad 118. The second interlayer insulating layer 119 may define a third contact hole h21 and a fourth contact hole h22 to expose the first conductive pad 116 and the second conductive pad 118, respectively. The third and the fourth contact holes may be respectively filled with a third conductive plug P1 and a fourth conductive plug P2. The MTJ structure C includes the conductive layer 60 and the material layer 64. The conductive layer 60 may be connected to the second conductive pad 118 through the fourth conductive plug P2, and the material layer 64 may be connected to the first conductive pad 116 through the third conductive plug P1.

Therefore, a current can flow from the material layer 64 having a plurality of magnetic layers to the first transistor T1 through the first conductive pad 116 and the first conductive plug 112. Here, the first transistor T1 maintains a turned-on state and the second transistor T2 maintains a turned-off state. Also, a current can flow from the conductive layer 60 to the second transistor T2 through the second conductive pad 118 and the second conductive plug 114. Here, the first transistor T1 maintains a turned-off state and the second transistor T2 maintains a turned-on state.

A third interlayer insulating layer 120 may be formed on the second interlayer insulating layer 119 to enclose the MTJ structure C. The third interlayer insulating layer 120 may be made of the same insulating material as the first and the second interlayer insulating layer 110 and 119, or other insulating materials may be used.

The first conductive line L1 may be formed on the third interlayer insulating layer 120 to make contact with a top of the material layer 64 of the MTJ structure C. That is, the first conductive line L1 makes contact with the capping layer 64f of the material layer 64. The insulating layer 62 may extend between the first conductive line L1 and the conductive layer 60 of the MTJ structure C to prevent the first conductive line L1 from making contact with the conductive layer 60. The conductive layer 60 may extend higher than the first conductive line L1.

A fourth interlayer insulating layer 122 may be formed on the third interlayer insulating layer 120 to cover the first conductive line L1 and enclose the extended portion of the conductive layer 60. The fourth interlayer insulating layer 122 may be formed of the same insulating material as the first, the second, and the third interlayer insulating layers 110, 119, and 120, or may be formed of other insulating materials. The second conductive line L2 may be formed on the fourth interlayer insulating layer 122 to make contact with the extended conductive layer 60.

Operation of a magnetic RAM in accordance with an embodiment of the present invention will now be described in detail. The first magnetic RAM is exemplarily used to describe the operation. The following description assumes that the magnetization orientation of the pinned layer 64c is the same as the magnetic field formed around the conductive layer 60 when a current flows from the transistor Tr to the conductive layer 60.

<Write>

Figure 14:
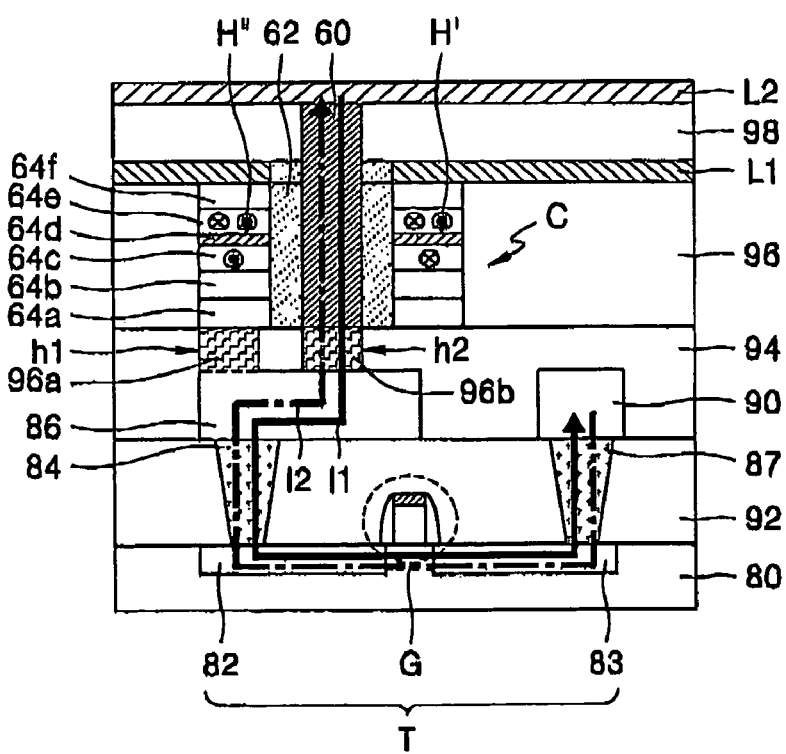
FIG. 14 illustrates a cross-sectional view showing a current passage and a magnetized state of a free magnetic layer during a data write mode of the magnetic RAM of FIG. 11.

Referring to FIG. 14, the first connecting unit 96a maintains an off-state. To indicate the off-state, the first connecting unit 96a is depicted with a dashed line. A first current I1 is appied to the second conductive line L2 after floating the first conductive line L1. The first current I1 applied to the second conductive line L2 flows towards the transistor Tr through the conductive layer 60, the conductive pad 86, and the conductive plug 84.

The first current I1 produces a magnetic field H' around the conductive layer 60 in opposition to the magnetization of the pinned layer 64c. Since the magnetization orientation of the free magnetic layer 64e is the same as the orientation of the magnetic field H', the magnetization orientations of the pinned layer 64c and the free magnetic layer 64e are opposite to each other. Therefore, the MTJ structure C has a high resistance. Hereinafter, it is assumed that a "0" is stored in the MTJ structure C when the MTJ structure C has a high resistance.

When the first current I1 flows in the reverse direction, i.e., when a second current I2 flows from the transistor Tr to the conductive layer 60, the second current I2 produces a magnetic field H" around the conductive layer 60. The orientation of the magnetic field H" is the same as that of the pinned layer 64c. Therefore, the free magnetic layer 64e and the pinned layer 64c have the same magnetization orientation to reduce the resistance of the MTJ structure C. Hereinafter, it is assumed that a "1" is stored in the MTJ structure C when the MTJ structure C has a reduced or low resistance.

Figure 15:
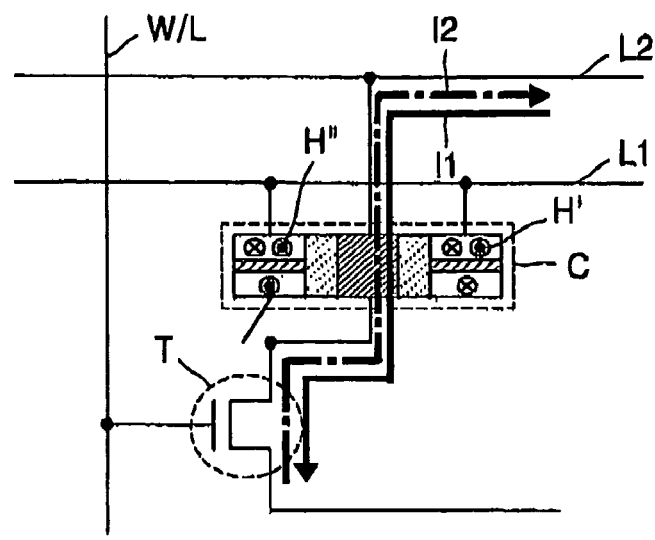
FIG. 15 illustrates an equivalent circuit showing a data write mode of the magnetic RAM of FIG. 11.

FIG. 15 illustrates an equivalent circuit showing the first and the second currents I1 and I2 flowing in the first magnetic RAM in the data write mode.

<Read>

Figure 16:
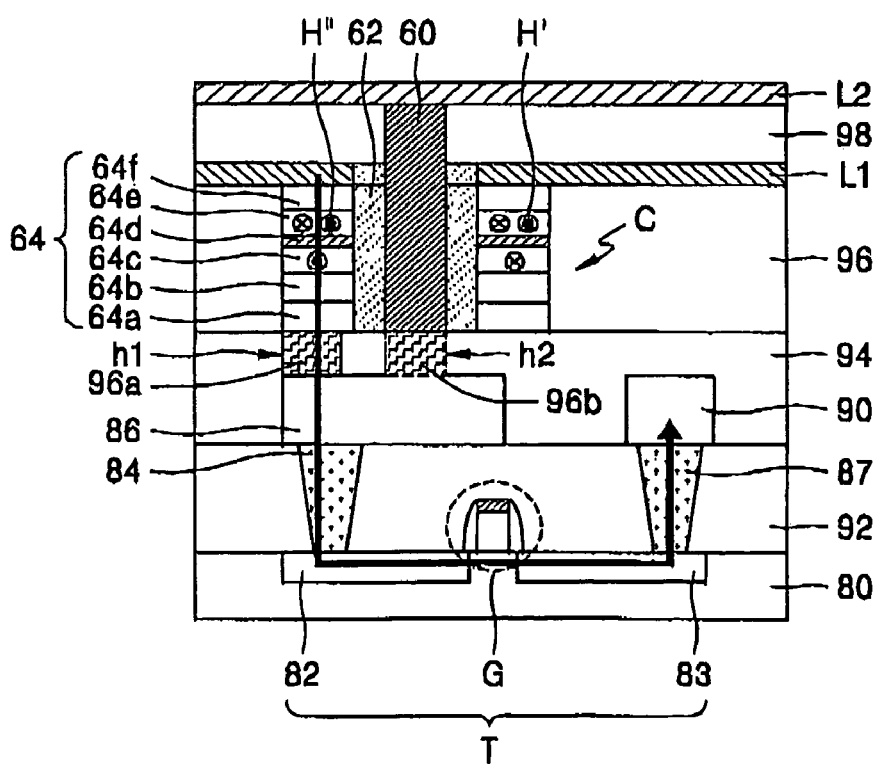
FIG. 16 illustrates a cross-sectional view showing a current passage and a magnetized state of a free magnetic layer during a data read mode of the magnetic RAM of FIG. 11.

Referring to FIG. 16, to read data from the first magnetic RAM, the second connecting unit 96b is kept in an off-state so that current does not flow from the conductive layer 60 to the transistor Tr through the conductive pad 86. To indicate the off-state, the second connecting unit 96b is depicted with a dashed line. In this off-state, a voltage is applied to the first magnetic RAM to create a current I from the first conductive line L1 to the transistor Tr through the material layer 64 and the conductive pad 86. Since the resistance of the MTJ structure C varies depending on the magnetization orientation of the free magnetic layer 64e, the amount of the current I also varies depending on the magnetization orientation of the free magnetic layer 64e. That is, data stored in the MTJ structure C can be read using this property.

For example, the amount of the current of the MTJ structure C is larger than a reference current value when the free magnetic layer 64e and the pinned layer 64c have the same magnetization orientation, i.e., a low resistance state of the MTJ structure C, and the amount of the current of the MTJ structure C is smaller than the reference current value when the free magnetic layer 64e and the pinned layer 64c have different magnetization orientations, i.e., a high resistance state of the MTJ structure C. Therefore, it may be assumed that a "1" is read from the first magnetic RAM when a current larger than the reference current value is measured after applying a voltage to the first magnetic RAM, and a "0" is read from the first magnetic RAM when a current smaller than the reference current value is measured after applying the voltage to the first magnetic RAM.

Figure 17:
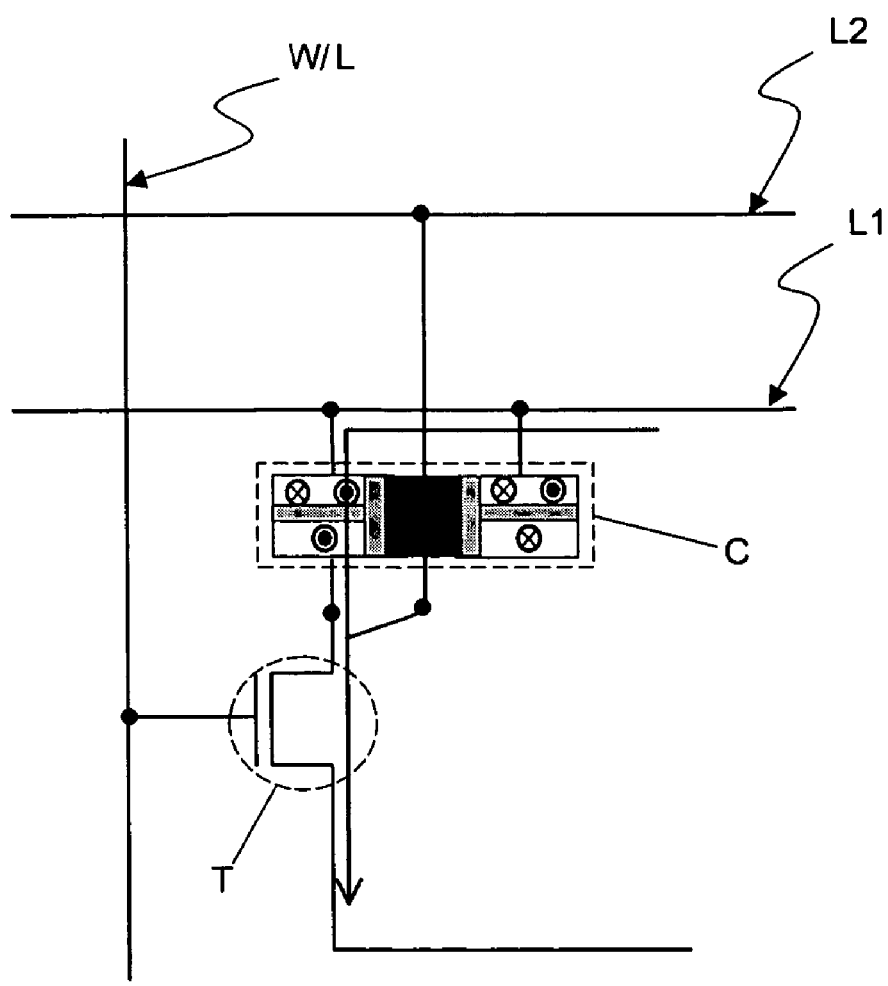
FIG. 17 illustrates an equivalent circuit showing a data read mode of the magnetic RAM of FIG. 11.

FIG. 17 is an equivalent circuit showing a current passage of the first magnetic RAM in the data read mode.

To write data in the second magnetic RAM, the first conductive line L1 is floated, and the first transistor T1 is kept in an off-state. To read data from the second magnetic RAM, the second conductive line L2 is floated, and the second transistor T2 is kept in an off-state.

As described above, the magnetic RAM of the present invention includes a cylindrical MTJ structure. The MTJ structure includes the conductive layer at the center, the insulating layer around the conductive layer and the material layer around the insulating layer. The material layer includes a plurality of magnetic layers that are vertically stacked along the conductive layer. The magnetic layers, e.g., the pinning layer, the pinned layer, the tuneling layer, the free magnetic layer, and the capping layer, are formed in a toroidal shape around and along the conductive layer.

Therefore, the conductive layer generates a circular closed magnetic field around it when a current flows through it. This closed magnetic field is also formed in the material layer. That is, the closed magnetic field is formed in the free magnetic layer without penetrating it, such that the free magnetic layer can be uniformly switched without abnormal pinning phenomena. Thus, the MTJ structure can be uniformly switched with a given magnetic field intensity. In other word, the number of MTJ structures that are not switched with a given magnetic field intensity can be minimized. Further, since the MTJ structure is designed to have a cylindrical shape, an intense magnetic field can be generated using a low current.

Exemplary embodiments of the present invention have been disclosed herein, and although specific terms are employed, they are used and are to be interpreted in a generic and descriptive sense only and not for purpose of limitation. For example, the first connecting unit 96a may abut a lower front surface of the material layer 64; the first magnetic RAM may be made without the transistor Tr; and the first and the second conductive lines L1 and L2 may not be aligned with each other in a vertical direction. Accordingly, it will be understood by those of ordinary skill in the art that various changes in form and details may be made without departing from the spirit and scope of the present invention as set forth in the following claims.

What is claimed is:

1. A magnetic memory device, comprising a magnetic tunneling junction (MTJ) structure including:
   an insulating layer surrounding a conductive layer; and
   an annular material layer surrounding the insulating layer, wherein:
      the MTJ structure has a cylindrical shape,
      the conductive layer, the insulating layer and the material layer of the MTJ structure are co-axial with one another, and
      the material layer includes a plurality of magnetic layers that are sequentially deposited in the length direction of the conductive layer.

2. The magnetic memory device as claimed in claim 1, wherein each of the magnetic layers is annular.

3. The magnetic memory device as claimed in claim 2, wherein the plurality of magnetic layers comprises a lower magnetic layer, a tunneling layer, and an upper magnetic layer that are sequentially stacked around and along the conductive layer.

4. The magnetic memory device as claimed in claim 3, wherein the lower magnetic layer comprises a pinning layer and a pinned layer that are sequentially stacked.

5. The magnetic memory device as claimed in claim 4, wherein the pinned layer comprises a hard magnetic layer which is one of a samarium cobalt (SmCo) layer and a neodymium iron boron (NdFeB) layer.

6. The magnetic memory device as claimed in claim 3, wherein the lower magnetic layer comprises a pinned layer made of a hard magnetic material.

7. The magnetic memory device as claimed in claim 3, wherein the upper magnetic layer comprises a soft magnetic layer selected from the group consisting of a nickel iron (NiFe) layer and a sequentially stacked layer of a cobalt iron (CoFe) layer and a nickel iron (NiFe) layer.

8. The magnetic memory device as claimed in claim 2, further comprising:
   a first conductive line connected to the material layer; and
   a second conductive line connected to the conductive layer.

9. The magnetic memory device as claimed in claim 8, wherein the second conductive line is formed above the first conductive line, and the first conductive line and the conductive layer are insulated from each other.

10. The magnetic memory device as claimed in claim 8, wherein the conductive layer protrudes upward to be connected with the second conductive layer.

11. The magnetic memory device as claimed in claim 2, further comprising a switching device under the MTJ structure, the switching device being connected to the conductive layer and the material layer.

12. The magnetic memory device as claimed in claim 11, further comprising:
   a first connecting unit having a first switching unit to switch current flow between the switching device and the material layer; and
   a second connecting unit having a second switching unit to switch current flow between the switching device and the conductive layer.

13. The magnetic memory device as claimed in claim 2, further comprising:
   a first transistor formed under the MTJ structure and connected with the material layer; and
   a second transistor formed under the MTJ structure and connected with the conductive layer.

14. The magnetic memory device as claimed in claim 13, wherein the first and the second transistors are formed on the same substrate, and a common electrode is connected between the first and the second transistors.

15. A method of operating a magnetic memory device including an MTJ structure, a first conductive line, a second conductive line, and a switching device, the MTJ structure having a cylindrical shape and including:
   an insulating layer surrounding a conductive layer, and
   an annular material layer surrounding the insulating layer, the material layer including a plurality of magnetic layers sequentially deposited in the length direction of the conductive layer, wherein:
      the conductive layer, the insulating layer and the material layer of the MTJ structure are co-axial with one another,
   the method comprising:
      applying a current to one of the first and second conductive lines after floating another one of the first and second conductive lines.

16. The method as claimed in claim 15, wherein applying the current comprises applying a write current to the second conductive line after floating the first conductive line to write data in the material layer.

17. The method as claimed in claim 15, wherein applying the current comprises:
   applying a read current to the first conductive line after floating the second conductive line;
   measuring the current passing through the material layer; and
   reading data from the material layer by comparing the measured current with a reference current.

18. A method of making a magnetic memory device including a magnetic tunneling junction (MTJ) structure, the method comprising:
   forming an insulating layer that surrounds a conductive layer; and
   forming an annular material layer that surrounds the insulating layer, wherein:
      the MTJ structure is formed in a cylindrical shape,
      the conductive layer, the insulating layer and the material layer of the MTJ structure are coaxial with one another, and
      the material layer includes a plurality of magnetic layers that are sequentially deposited in the length direction of the conductive layer.

19. The method as claimed in claim 18, wherein:
   forming the annular material layer includes forming a plurality of sequential magnetic layers and forming a hole in the plurality of sequential magnetic layers;
   forming the insulating layer includes forming the insulating layer in the hole, the insulating layer lining sidewalls of the hole; and
   forming the conductive layer includes forming the conductive layer in the hole having the insulating layer therein.

20. The method as claimed in claim 19, wherein:
   forming the plurality of sequential magnetic layers comprises:
      forming a lower magnetic layer;
      forming a tunneling layer; and
      forming an upper magnetic layer, and
   the lower magnetic layer, the tunneling layer and the upper magnetic layer are sequentially stacked.

21. The magnetic memory device as claimed in claim 20, wherein forming the lower magnetic layer comprises:
   forming a pinning layer; and
   forming a pinned layer, the pinning layer and the pinned layer being sequentially stacked.

22. The magnetic memory device as claimed in claim 1, wherein the plurality of magnetic layers have a same outer diameter.

23. The magnetic memory device as claimed in claim 22, wherein a conductive line contacts an entire annular upper surface of an uppermost portion of the material layer, the conductive line being spaced apart from the conductive layer.

* * * * *